(12) United States Patent
Ode

(10) Patent No.: US 8,211,229 B2
(45) Date of Patent: Jul. 3, 2012

(54) APPARATUS INCLUDING COLUMN HAVING HOLLOW PART FILLED WITH FILLER AND SOLID FILM-FORMATION MATERIAL

(75) Inventor: Hiroyuki Ode, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 763 days.

(21) Appl. No.: 12/246,519

(22) Filed: Oct. 7, 2008

(65) Prior Publication Data
US 2009/0092856 A1    Apr. 9, 2009

(30) Foreign Application Priority Data
Oct. 9, 2007 (JP) .................. 2007-263249

(51) Int. Cl.
*B05C 11/00* (2006.01)
*C23C 16/00* (2006.01)

(52) U.S. Cl. ..... 118/600; 118/732; 118/900; 427/248.1; 427/255.23

(58) Field of Classification Search .......... 118/600–612, 118/732, 715, 716, 726, 900; 427/248.1–255.7; 428/697
See application file for complete search history.

(56) References Cited

U.S. PATENT DOCUMENTS

| 2005/0208220 A1* | 9/2005 | Long et al. ................. 427/255.6 |
| 2007/0120222 A1* | 5/2007 | Ode ............................. 257/532 |

FOREIGN PATENT DOCUMENTS

| JP | 2003-213425 | 7/2003 |
| JP | 2003-282556 | 10/2003 |
| JP | 2006-144083 | 6/2006 |

* cited by examiner

*Primary Examiner* — Ha Tran T Nguyen
*Assistant Examiner* — Raj R Gupta
(74) *Attorney, Agent, or Firm* — Young & Thompson (57) ABSTRACT

A solid film-formation material feeding apparatus includes a supercritical fluid supply source for supplying supercritical fluid; and a column which is connected to the supercritical fluid supply source, and has a hollow part which is filled with a filler which is inactive for the supercritical fluid, wherein the hollow part can be further filled with a solid film-formation material which is soluble in the supercritical fluid. A column assembly which includes a plurality of the columns which may be connected in parallel to each other.

18 Claims, 6 Drawing Sheets

(PRIOR ART)

APPARATUS INCLUDING COLUMN HAVING HOLLOW PART FILLED WITH FILLER AND SOLID FILM-FORMATION MATERIAL

BACKGROUND OF THE INVENTION

1. Field of the Invention

The present invention relates to an apparatus for feeding a solid film-formation material.

Priority is claimed on Japanese Patent Application No. 2007-263249, filed Oct. 9, 2007, the contents of which are incorporated herein by reference.

2. Description of Related Art

A perovskite material (e.g., SrTiO) is anticipated as the next-generation high-dielectric-constant film, and a precursor therefor is generally in a solid state having a low vapor pressure. It is very difficult to vaporize such a precursor using a known vaporizer, and to feed it into a film-formation chamber.

In addition, even if the relevant vaporization in a vaporizer is possible, the precursor may be deposited inside a pipe connected to the film-formation chamber or in the chamber itself. In such a case, the amount of the fed precursor may not be controlled, or the apparatus may have a problem.

As a perovskite material generally includes two metal elements, accurate control of the amount of each metal material fed into the film-formation chamber corresponds to the control of the relevant film composition, and thus is very important. Therefore, the process of forming a perovskite film using a known film-formation technique such as CVD (chemical vapor deposition) and ALD (atomic layer deposition) has not been sufficiently established for a long period of time.

In recent supercritical film formation, which is anticipated as the next-generation film-formation technique, any reagent which dissolves in a supercritical fluid can be used as a precursor, regardless of the state (i.e., solid, liquid, or gas) of the reagent. Therefore, it can be understood that such a reagent has a potential for solving the above-described problem attendant on the development of the process for forming a perovskite film. Accordingly, methods for feeding such a solid film-formation material as a precursor have been developed (see, for example, Patent Documents 1 to 3).

Patent Document 1: Japanese Unexamined Patent Application, First Publication No. 2003-213425.
Patent Document 2: Japanese Unexamined Patent Application, First Publication No. 2003-282556.
Patent Document 3: Japanese Unexamined Patent Application, First Publication No. 2006-144083.

However, the present inventor has recognized that no method or apparatus for performing stationary feeding of a solid film-formation material at a desired speed has been established.

SUMMARY

The present invention seeks to solve one or more of the above problems, or to improve upon those problems at least in part.

In one embodiment, there is provided a solid film-formation material feeding apparatus that includes a supercritical fluid supply source for supplying supercritical fluid; and a column which is connected to the supercritical fluid supply source, and has a hollow part which is filled with a filler which is inactive for the supercritical fluid, wherein the hollow part can be further filled with a solid film-formation material which is soluble in the supercritical fluid.

There is also provided a supercritical film-formation apparatus which includes the solid film-formation material feeding apparatus as described above.

There is also provided a film formation method that includes:

feeding supercritical fluid from the upstream side of a column which is filled with a filler and a solid film-formation material, wherein the filler is inactive for the supercritical fluid, and the solid film-formation material is soluble in the supercritical fluid; and feeding the supercritical fluid, which includes the solid film-formation material, to a film-formation chamber, so as to form a film, which is formed by the solid film-formation material, on a substrate.

There is also provided a semiconductor device having a film formed by the method as described above.

In accordance with the solid film-formation material feeding apparatus of the present invention, a solid film-formation material having a low vapor pressure or a liquid film-formation material having a high viscosity can be stationarily fed into a film-formation chamber at a desired feeding rate. Therefore, it is possible to control the composition ratio of a material (e.g., perovskite or chalcogenide) which consists of a plurality of metal elements.

BRIEF DESCRIPTION OF THE DRAWINGS

The above features and advantages of the present invention will be more apparent from the following description of certain preferred embodiments taken in conjunction with the accompanying drawings, in which:

FIGS. 5A and 5B are graphs showing relationships between the flow time of the supercritical fluid and the concentration of the reagent in the film-formation chamber, where FIG. 5A shows a comparative example which uses a conventional solid film-formation material feeding apparatus, and FIG. 5B shows an example which uses a solid film-formation material feeding apparatus in accordance with the present invention.

DETAILED DESCRIPTION OF PREFERRED EMBODIMENTS

Figure 6:
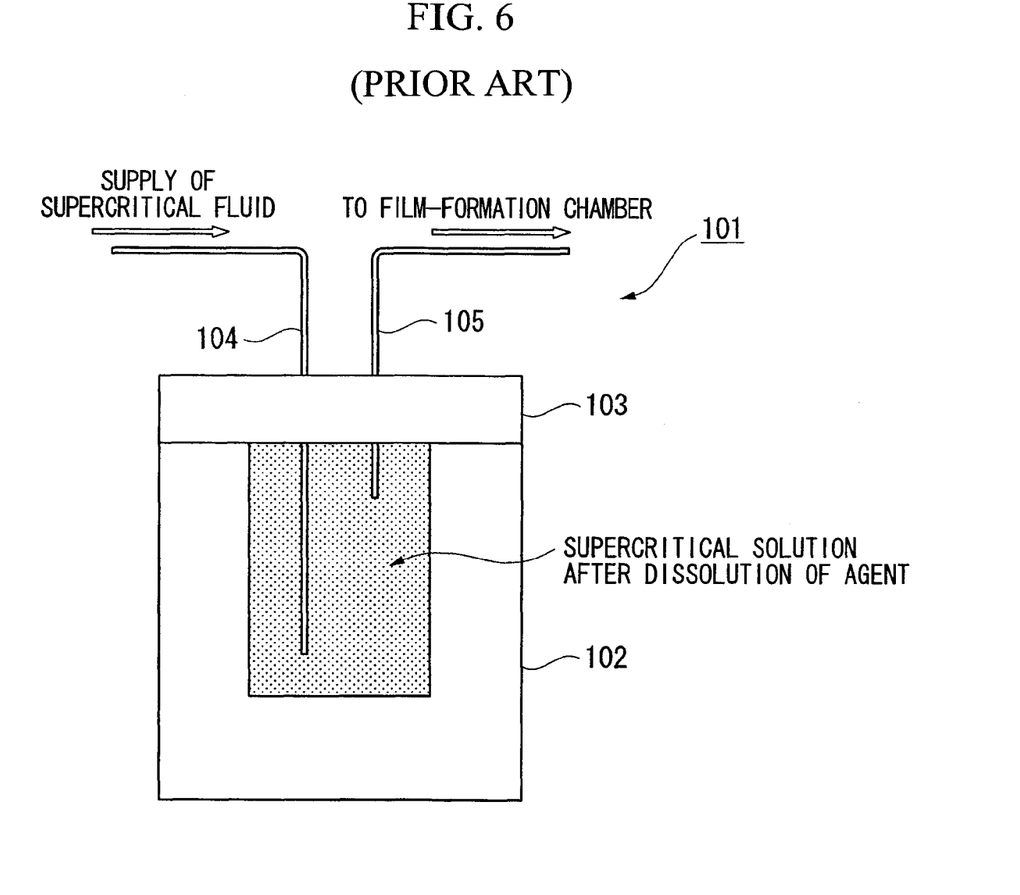
FIG. 6 is a schematic diagram which shows a part of a conventional solid film-formation material feeding apparatus using a supercritical fluid, and specifically shows a dissolution chamber.

Before describing the present invention, specific related art will be explained in detail with reference to FIG. 6 in order to facilitate the understanding of the present invention. FIG. 6 shows a part of a known apparatus for feeding a solid film-formation material, which uses a supercritical fluid. This apparatus has a dissolution chamber 101, which is formed of a container main body 102 for containing a solid film-formation material, a cap body 103 for covering the container main body 102 tightly, a feeding pipe 104 for supplying a supercritical fluid via the cap body 103 into the container main body 102, and a drawing pipe 105 for drawing the supercritical fluid, in which the solid film-formation material is dissolved, to a film-formation chamber. That is, a supercritical fluid, which is supplied via the feeding pipe 104 to the container main body 102, flows irregularly in every direction so that the solid film-formation material is dissolved therein, and then the supercritical fluid is discharged from the container main body 102 by means of the supply pressure of the supercritical fluid.

Figure 5A:
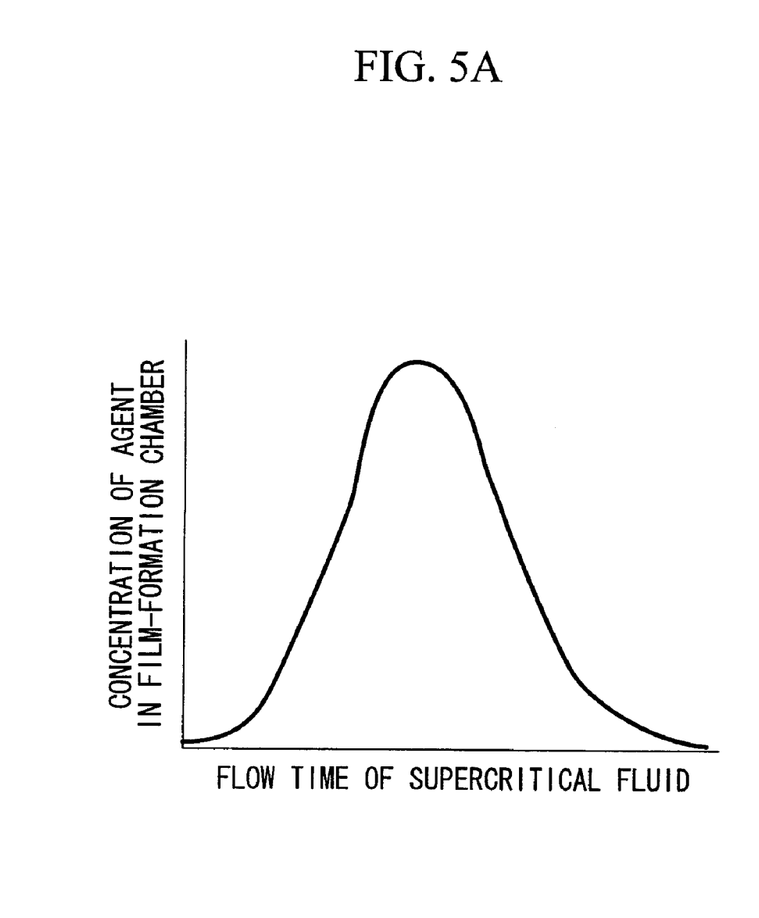

If any amount of the solid film-formation material is contained in the container main body 102 (as a dissolution chamber) in FIG. 6; a supercritical fluid is then fed so as to dissolve the solid film-formation material; and the relevant solution is transferred via the drawing pipe 105 by means of a pump for supplying the supercritical fluid, then the relationship shown by a profile in FIG. 5A is obtained between the flow time of the supercritical fluid and the concentration of the reagent in the film-formation chamber. In accordance with the profile, the concentration of the reagent (i.e., solid film-formation material) always varies, and there is almost no time in which the solid film-formation material can be transferred at a constant concentration. In addition, a stirrer is generally necessary for effectively dissolving the solid film-formation material. However, the container main body 102 has a high internal pressure, and thus it is not easy to reliably and efficiently stir the solid film-formation material in the container main body 102.

The invention will now be described herein with reference to illustrative embodiments. In the drawings, the size, thickness, dimensions, or the like, of a shown apparatus may have an relationship which differs from actual dimensional relationships between the structural elements of the actual apparatus.

Those skilled in the art will recognize that many alternative embodiments can be accomplished using the teachings of the present invention and that the invention is not limited to the embodiments illustrated for explanatory purposes.

Apparatus for Feeding a Solid Material

Figure 1:
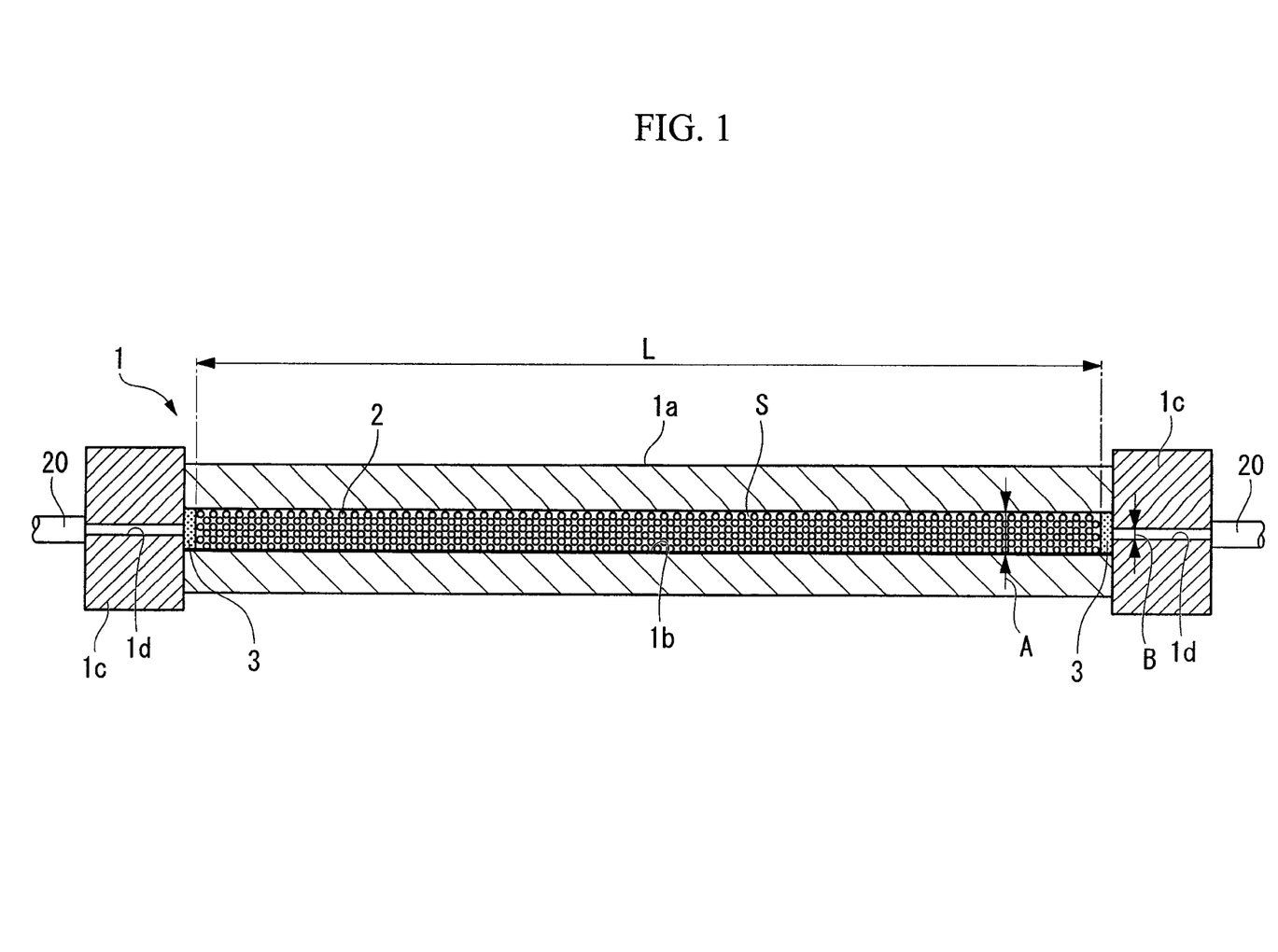
FIG. 1 is a general sectional view showing a column for dissolving a solid film-formation material, which can be used in a solid film-formation material feeding apparatus in accordance with the present invention.

Referring now to FIG. 1, an apparatus for feeding a solid material according to a first embodiment of the present invention is formed using a "column" principle, and has a solid film-formation material dissolution column 1 (called simply the "column") shown in FIG. 1, and a supply source (not shown) for supplying a supercritical fluid.

The column 1 is a high-pressure container having an elongated cylindrical form, and has a cylindrical part 1a (as a container) in which a hollow part 1b having substantially the same form (i.e., cylindrical form having an identical section) is provided. The hollow part 1b is closely filled with a filler 2 such as glass beads, which is inactive for the supercritical fluid. Each gap in the filler 2 is closely filled with a solid film-formation material S.

In addition, draw-in/draw-out parts 1c are attached to both sides of the cylindrical part 1a. At the center of each draw-in/draw-out part 1c, a passage hole 1d is formed, which communicates with the hollow part 1b. Additionally, a pipe 20 is connected to the outside of each draw-in/draw-out part 1c. A supply source for supplying a supercritical fluid (e.g., carbon dioxide ($CO_2$)) is connected to any one of the pipes 20.

Preferably, the column 1 has a shape which satisfies the dimensional relationship:

(length L of hollow part 1b)/(inner diameter A of hollow part 1b)>10

Also preferably, the inner diameter A of the hollow part 1b is 1 to 12 cm. More preferably, it is 1 to 6 cm, and most preferably, 1 to 3 cm.

Also preferably, the length L of the hollow part 1b is 20 to 150 cm. More preferably, it is 50 to 150 cm, and most preferably, 100 to 150 cm.

It is also preferable to provide filters 3 to both ends of the column 1, so as to prevent the filler 2 from being drawn into the passage holes 1d.

As the solid film-formation material S for filling the hollow part 1b is distributed at each gap of the filler 2, the material S is arranged over the entire inside of the hollow part 1b. Therefore, the contact area between the supercritical fluid and the solid film-formation material S is very large, so that the solid film-formation material S can be efficiently dissolved even without stirring.

When a supercritical fluid is drawn into the hollow part 1b through any one of the pipes 20, the supercritical fluid in the hollow part 1b is rapidly transformed into a saturated solution of the solid film-formation material S. After that, when the supercritical fluid is further supplied, the solid film-formation material S is dissolved and consumed at the upstream side where a pure supercritical fluid is supplied. In contrast, in the midstream and downstream areas, a saturated material, in which the solid film-formation material S has been sufficiently dissolved through the upstream area, flows. Therefore, no solid film-formation material S is consumed in the midstream and downstream areas. That is, in the hollow part 1b, dissolution of the solid film-formation material S occurs sequentially from the upstream side toward the downstream side, and thus the supercritical fluid having a constant concentration (i.e., saturated concentration) can be forwarded until the solid film-formation material S at the downstream side has been consumed. In order to provide this function, the supercritical fluid must flow in an ideal single direction (i.e., upstream side to downstream side). As described above, in the hollow part 1b, the supercritical fluid flows through thin passages such as gaps in the filler 2, thereby preventing inverse current or convention.

Preferably, the filler consists of round elements (each having a round shape), which are sufficiently larger than the particles or powders of the solid film-formation material S, but have a diameter of 2 mm or smaller, and more preferably, 0.5 to 2 mm. If using the round elements, the most-closely filled state (i.e., ideal state) has a filling rate of 74%. Here, the remaining (i.e., not filled) volume is filled with the solid film-formation material S, and thus the above filling density is preferable.

The method for filling the solid film-formation material S is not specifically limited, and any one of the following methods may be employed: (i) a method of heating the solid film-formation material S so as to draw the melted solid film-formation material S into the hollow part 1b, (ii) a method of dissolving the solid film-formation material S in any solvent, by which a high-concentration solution can be obtained, so as to adjust the solution of the solid film-formation material S; drawing the solution into the hollow part 1b; and evaporating only the solvent by means of heating, and (iii) a method of preparing a preparatory filler in which the filler and the solid film-formation material S are sufficiently mixed in advance, and drawing the preparatory filler into the hollow part 1b.

Column Assembly

Figure 2:
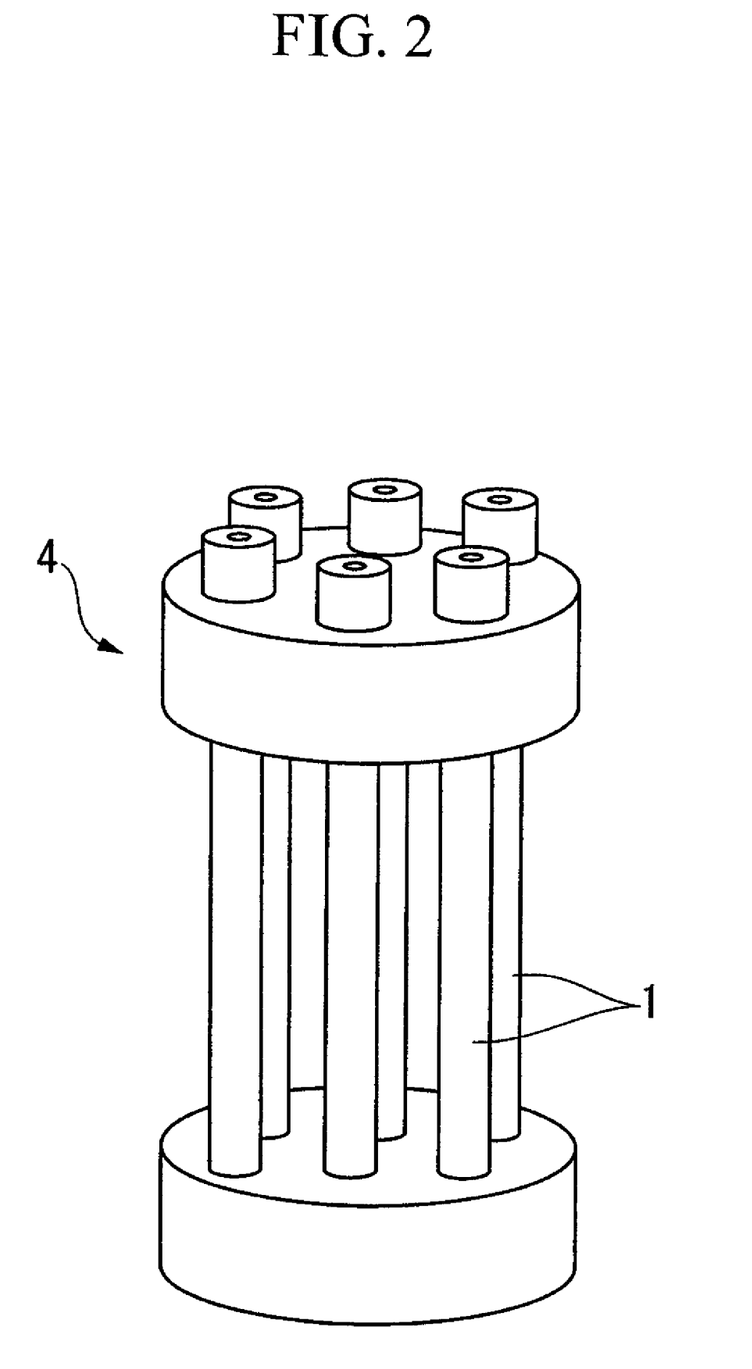
FIG. 2 is a general perspective view showing a column assembly which can be used in a solid film-formation material feeding apparatus in accordance with the present invention.

When all the solid film-formation material S in the column 1 has been consumed, the column itself must be replaced. Therefore, as shown in FIG. 2, it is preferable to connect a column assembly 4, in which a plurality of similar columns 1 are installed in parallel, to the relevant apparatus.

Here, it is unpreferable to increase the diameter of each column 1 so as to extend the time limit for usage of the column 1. This is because if increasing the diameter of the column 1, it should include an area (at an end or corner of the column 1) into which the supercritical fluid (drawn from the relevant pipe 20) cannot be easily drawn, and the consumption of the solid film-formation material S in the column 1 is not efficiently performed. Therefore, it is preferable that the inner diameter A of the hollow part 1b is five times as large as the inner diameter B of each passage hole 1b, or smaller.

The time limit for usage of the column 1 when the solid film-formation material S therein has been efficiently dissolved and consumed can be evaluated by means of the following formulas (I) to (III), which use (i) the amount (g) of the staffed solid film-formation material, (ii) the solubility (g/L) of the reagent (i.e., solid film-formation material) in the relevant supercritical fluid under specific dissolution conditions, and (iii) the flow rate (L/min) of the supercritical fluid:

amount (g) of solid film-formation material S/solubility (g/L)=amount (L) of supercritical fluid required for consuming all of solid film-formation material S   <Formula (I)> amount (L) of supercritical fluid required for consuming all of solid film-formation material S/flow rate (L/min)=time (min) necessary for consuming all of solid film-formation material S   <Formula (II)> time (min) necessary for consuming all of solid film-formation material S×safety factor (0.5 to 0.8)= time limit for usage (min)   <Formula (III)>

Based on the above, the replacement cycle of the column assembly 4 is determined. The column assembly 4 which was replaced can be used again by refilling the solid film-formation material S into each column by means of a filling method similar to the method described above.

Figure 3:
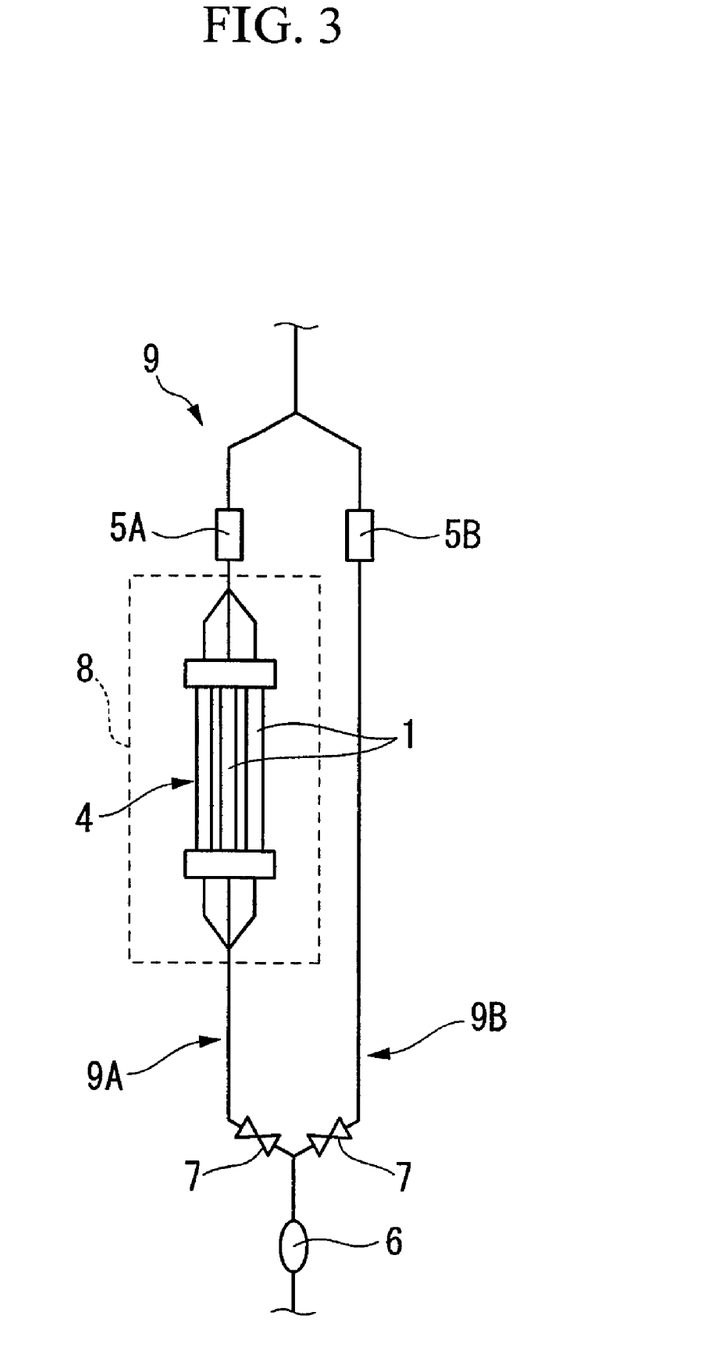
FIG. 3 is a schematic diagram showing the structure of a solid film-formation material feeding apparatus as an embodiment of the present invention.

FIG. 3 shows a solid film-formation material feeding apparatus 9 having a column assembly 4. The solid film-formation material feeding apparatus 9 is formed by two systems: one system has a first pipe 9A at which the column assembly 4 and a mass flow controller 5A are provided, and the other system has a second pipe 9B at which only a mass flow controller 5B is provided. The first pipe 9A and the second pipe 9B are arranged in parallel to each other, and a concentration meter 6 is provided at the downstream side with respect to the junction of the first pipe 9A and the second pipe 9B.

The mass flow controller 5A is provided at the upstream side with respect to the column assembly 4. The flow rate of carbon dioxide (i.e., supercritical fluid) into each system is controlled by means of the two mass flow controllers 5A and 5B, by which the relevant film-formation material having a saturated concentration can be diluted to have a desired concentration. The concentration of the film-formation material can be monitored by using the concentration meter 6 (e.g., a UV-V is spectrometer).

Figure 5B:
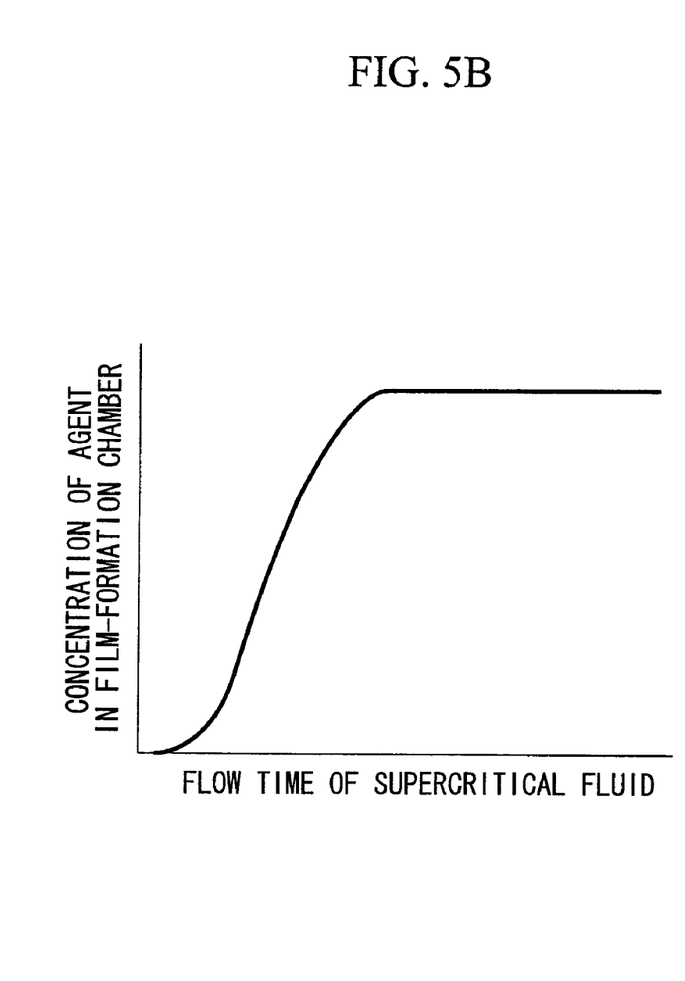

When using the above-described solid film-formation material feeding apparatus 9, the relationship between the flow time of the supercritical fluid and the concentration of the supercritical solution obtains a profile as shown in FIG. 5B. That is, in comparison with the conventional profile, a time period, in which the concentration of the reagent (i.e., solid film-formation material) is constant, appears. The concentration of the solid film-formation material can be controlled by using the mass flow controllers 5A and 5B. Therefore, even when the film-formation material is a solid material, it can be stationarily fed into a film-formation chamber at a desired concentration.

Supercritical Film-Formation Apparatus

Figure 4:
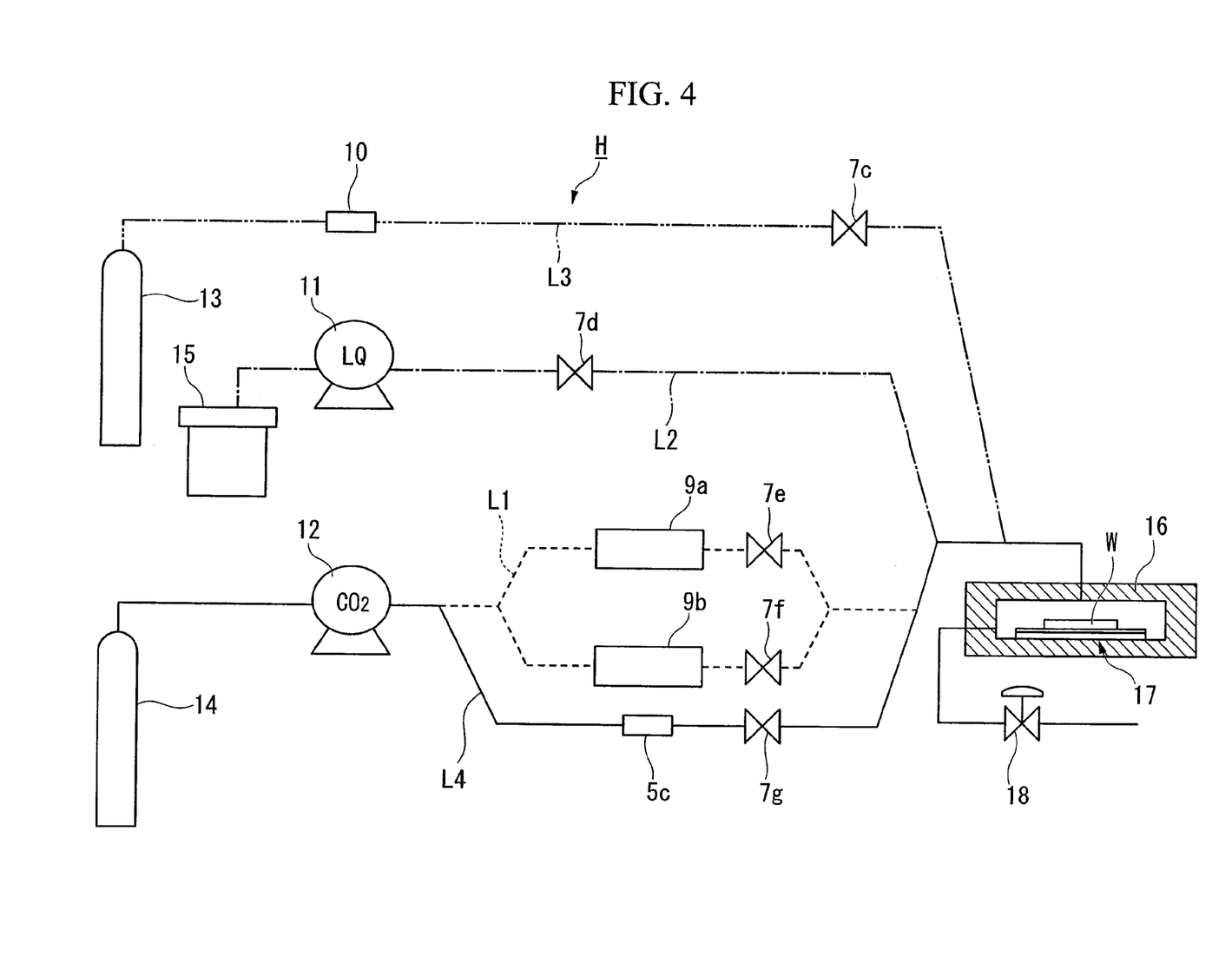
FIG. 4 is a schematic diagram showing the structure of a supercritical film-formation apparatus employing a solid film-formation material feeding apparatus, as an embodiment of the present invention.

As shown in FIG. 4, the film formation method using the solid film-formation material feeding apparatus 9 may be performed by a supercritical film-formation apparatus H having piping which includes the solid film-formation material feeding apparatus 9.

Generally, the supercritical film-formation apparatus H has four supply systems which are:

(i) a solid film-formation material supply line L1 (i.e., solid reagent supply line) which includes two solid film-formation material feeding apparatuses 9a and 9b (through two branches) and check valves 7e and 7f, (ii) a liquid reagent supply line L2 which includes a liquid reagent container 15, a liquid reagent pump 11, and a check valve 7d, (iii) a gas reagent supply line L3 which includes a gas cylinder 13, a mass flow controller 10 for a high-pressure gas, and a check valve 7c, and (iv) a supercritical fluid supply line L4 which includes a carbon dioxide cylinder 14 (as a supply source of supercritical fluid), a carbon dioxide flow pump 12, a mass flow controller 5c, and a check valve 7g.

The supercritical film-formation apparatus H also has a film-formation chamber 16 to which the lines L1, L2, L3, and L4, which are integrated, are connected.

In the film-formation chamber 16, a wafer heater 17 is provided, on which a wafer W is disposed. The following film formation procedure is performed while the inner pressure of the film-formation chamber 16 is controlled using a back-pressure controller 18 connected to the outside of the film-formation chamber 16.

Film Formation Method

In the present embodiment, a film formation procedure for forming an $SrTiO_3$ film by using the film-formation material feeding apparatus 9 will be explained as an example. The present invention is not limited to this example.

First, the column assembly 4 is filled with a solid film-formation material, which is $Sr(THD)_2$[bis(2,2,6,6-tetramethyl-3,5-heptanedionate)strontium], so that the solid material (i.e., Sr material) can be supplied through the solid film-formation material supply line L1.

In addition, a Ti material, which is $Ti(MPD)(THD)_2$[bis(2,2,6,6-tetramethyl-3,5-heptanedionate)-2-methyl-2,4-pentane-dioxytitanium], is contained in the liquid reagent container 15, so that it can be supplied via the liquid reagent pump 11 through the liquid reagent supply line L2.

Oxygen, which is a reaction reagent, is fed into the film-formation chamber 16 through the gas reagent supply line L3 while the supply speed thereof is controlled by the mass flow controller 10.

In the film-formation chamber 16, a substrate (e.g., an Si wafer), on which an $SrTiO_3$ film will be formed, is disposed on the wafer heater 17. After that, supercritical carbon dioxide is supplied to the film-formation chamber 16 through the supercritical fluid supply line L4, so as to produce a supercritical atmosphere (e.g. by carbon dioxide having a pressure of 12 MPa) in the film-formation chamber 16. Then, the relevant substrate is heated to obtain a film-formation temperature (e.g., 400° C.) of an $SrTiO_3$ film.

When the temperature and pressure conditions in the film-formation chamber 16 have been adjusted, the above-described Sr material, Ti material, and oxygen are fed simultaneously or successively. Preferably, the amount and feeding rate (or speed) of each reagent is determined through a systematic and basic examination so as to obtain a target composition ratio (e.g., Sr:Ti:O=1:1:3).

When a film-formation time (period) has elapsed, heating of wafer W and supply of the precursors are stopped. Here, the film thickness of the formed $SrTiO_3$ film depends on the film-formation time. Therefore, it is necessary to determine the film-formation time also through a systematic and basic examination.

After that, the film-formation chamber is depressurized to have the atmospheric pressure by discharging carbon dioxide from the film-formation chamber 16, so that the wafer W after the film formation can be removed from the chamber.

The $SrTiO_3$ film formed by the above-described procedure may be used as the next-generation capacitor dielectric film.

It is apparent that the present invention is not limited to the above embodiments, but may be modified and changed without departing from the scope and spirit of the invention.

For example, the above-described solid film-formation material supply line L1, the liquid reagent supply line L2, the gas reagent supply line L3, and the supercritical fluid supply line L4 may be individually connected to different ports of the film-formation chamber, and the solid film-formation material, the liquid reagent, the gas reagent, and the supercritical fluid may be supplied through the corresponding ports.

In addition, the present invention can be applied, not only to a solid film-formation material, but also to a liquid film-formation material whose viscosity is too high to flow by a pump for forwarding a liquid reagent.

Accordingly, a solid film-formation material having a low vapor pressure or a liquid film-formation material having a high viscosity can be stationarily fed into a film-formation chamber at a desired feeding rate. It is also possible to control the composition ratio of a material (e.g., perovskite or chalcogenide) which consists of a plurality of metal elements.

INDUSTRIAL APPLICABILITY

The present invention can be widely applied to any semiconductor device having a film formed using a solid film-formation material or a liquid film-formation material having a high viscosity. In particular, application to the next-generation capacitor dielectric film is expected.

What is claimed is:

1. A solid film-formation material feeding apparatus comprising:
a column configured to receive a supercritical fluid, and including a hollow part which is filled with a filler which is inactive for the supercritical fluid, the filler defining gaps within the hollow part being filled with a solid film-formation material which is soluble in the supercritical fluid, in order to transform the supercritical fluid into a solution of the solid film-formation material in the hollow part.

2. The solid film-formation material feeding apparatus in accordance with claim 1, wherein the column having the hollow part has the following dimensional relationship:

(length of the column)/(inner diameter of the column) >10.

3. The solid film-formation material feeding apparatus in accordance with claim 1, further comprising:
a first pipe at which the column, a mass flow controller, and a first valve are provided; and
a second pipe at which another mass flow controller and a second valve are provided, wherein:
the first pipe and the second pipe are connected in parallel so that the supercritical fluid is drawn into both the first and second pipes, and the flows of the supercritical fluid drawn out from the first and second pipes join each other; and
the flow rate of each of the first and second pipes is controlled by its respective mass flow controller, so as to control the concentration of the solid film-formation material in the joined supercritical fluid.

4. A supercritical film-formation apparatus, comprising the solid film-formation material feeding apparatus in accordance with claim 1.

5. The solid film-formation material feeding apparatus in accordance with claim 1, further comprising:
a cylinder containing a pure carbon dioxide as the supercritical fluid; and
a flow pump configured to convey the supercritical fluid from the cylinder to a first node, the first node being connected to a first end of the hollow part;
a mass flow controller and a first valve provided in series between the first node and a chamber; and
a second valve provided between a second end of the hollow part and the chamber.

6. The solid film-formation material feeding apparatus in accordance with claim 1,
wherein the filler includes beads, and the solid film-formation material is distributed at gap of the beads.

7. The solid film-formation material feeding apparatus in accordance with claim 6,
wherein the solid film-formation material is arranged over the entire inside of the hollow part.

8. The solid film-formation material feeding apparatus in accordance with claim 7, the column further comprising:
a draw-in part provided at an upstream side of the column to draw in the supercritical fluid into the hollow part;
a draw-out part provided at a downstream side of the column to draw out the solution;
a first filter provided between the drawn-in part and the hollow part; and
a second filter provided between the drawn-out part and the hollow part.

9. The solid film-formation material feeding apparatus in accordance with claim 1, further comprising: a column assembly which includes a plurality of columns which are connected in parallel to each other.

10. The solid film-formation material feeding apparatus in accordance with claim 9, wherein:
after the solid film-formation material in all the columns in the column assembly is consumed, the column assembly is refilled with the solid film-formation material so as to be used again.

11. A supercritical film-formation apparatus, comprising the solid film-formation material feeding apparatus in accordance with claim 9.

12. The solid film-formation material feeding apparatus in accordance with claim 9, further comprising:
a first pipe at which the column assembly, a mass flow controller, and a first valve are provided; and
a second pipe at which another mass flow controller and a second valve are provided, wherein:
the first pipe and the second pipe are connected in parallel so that the supercritical fluid is drawn into both the first and second pipes, and the flows of the supercritical fluid drawn out from the first and second pipes join each other; and
the flow rate of each of the first and second pipes is controlled by its respective mass flow controller, so as to control the concentration of the solid film-formation material in the joined supercritical fluid.

13. A supercritical film-formation apparatus, comprising the solid film-formation material feeding apparatus in accordance with claim 12.

14. A solid film-formation material feeding apparatus, comprising:
- a draw-in part including a first passage hole for receiving a supercritical fluid;
- a draw-out part including a second passage hole;
- a cylindrical part including a first end attached to the draw-in part and a second end attached to the draw-out part, the cylindrical part including a hollow part arranged such that a fluid flows from the first passage hole to the second passage hole through the hollow part;
- a filler filled in the hollow part, the filler being inactive for the supercritical fluid;
- a film formation material filled in gaps defined by the filler; and
- first and second filters provided to the first and second ends, respectively to prevent the filler from being drawn into the first and second passage holes.

15. The solid film-formation material feeding apparatus in accordance with claim 14,
wherein the filler includes beads, and the solid film formation material is distributed at gap of the beads.

16. The solid film-formation material feeding apparatus in accordance with claim 15,
wherein the solid film-formation material is arranged over the entire inside of the hollow part.

17. The solid film-formation material feeding apparatus in accordance with claim 14, further comprising:
- a cylinder containing a pure carbon dioxide as the supercritical fluid; and
- a flow pump configured to convey the supercritical fluid from the cylinder to a first node, the first node being connected to a first end of the hollow part;
- a mass flow controller and a first valve provided in series between the first node and a chamber; and
- a second valve provided between a second end of the hollow part and the chamber.

18. The solid film-formation material feeding apparatus in accordance with claim 17, further comprising:
- a second mass flow controller provided between the first node and the chamber such that the second valve, the hollow part and the second mass flow controller are arranged in series between the first node and the chamber.

* * * * *